US008204140B2

(12) United States Patent
Hoffman et al.

(10) Patent No.: US 8,204,140 B2
(45) Date of Patent: Jun. 19, 2012

(54) SUBSCRIBER UNIT AND METHOD FOR VARIABLE FORWARD ERROR CORRECTION (FEC) DECODING

(75) Inventors: John E. Hoffman, Indialantic, FL (US); George Rodney Nelson, Jr., Merritt Island, FL (US); Daniel I. Riley, West Melbourne, FL (US); Antoine J. Rouphael, Escondido, CA (US); James A. Proctor, Jr., Indialantic, FL (US)

(73) Assignee: IPR Licensing, Inc., Wilmington, DE (US)

( * ) Notice: Subject to any disclaimer, the term of this patent is extended or adjusted under 35 U.S.C. 154(b) by 362 days.

(21) Appl. No.: 12/326,487

(22) Filed: Dec. 2, 2008

(65) Prior Publication Data
US 2009/0135950 A1    May 28, 2009

Related U.S. Application Data

(63) Continuation of application No. 11/633,970, filed on Dec. 5, 2006, now Pat. No. 7,502,424, which is a continuation of application No. 11/264,847, filed on Nov. 2, 2005, now Pat. No. 7,145,964, which is a continuation of application No. 09/773,253, filed on Jan. 31, 2001, now Pat. No. 6,973,140, which is a continuation-in-part of application No. 09/447,022, filed on Nov. 22, 1999, now Pat. No. 6,785,323, which is a continuation-in-part of application No. 09/263,358, filed on Mar. 5, 1999, now Pat. No. 7,593,380.

(51) Int. Cl.
*H04L 5/12* (2006.01)
*H04L 27/36* (2006.01)
*H04L 27/06* (2006.01)
*H04L 27/00* (2006.01)

(52) U.S. Cl. ......... 375/262; 375/295; 375/341; 375/377
(58) Field of Classification Search .................. 375/316, 375/324, 329–333, 261, 262, 279, 280, 340, 375/341, 377, 295; 714/746, 752, 799, 800
See application file for complete search history.

(56) References Cited

U.S. PATENT DOCUMENTS
4,460,992 A    7/1984    Gutleber
(Continued)

FOREIGN PATENT DOCUMENTS
EP    0 443 061    2/1990
(Continued)

OTHER PUBLICATIONS
Wang, B., and Chang, P., "Spread Spectrum Multiple-Access with DPSK Modulation and Diversity for Image Transmission over Indoor Radio Multipath Fading Channels", *IEEE*, pp. 200-214 (1996).
(Continued)

*Primary Examiner* — Tesfaldet Bocure
(74) *Attorney, Agent, or Firm* — Volpe and Koenig, P.C.

(57) ABSTRACT

The present invention provides for making code rate adjustments and modulation type adjustments in a pseudonoise (PN) encoded CDMA system. Coding rate adjustments may be made by changing the number of information bits per symbol, or Forward Error Code (FEC) coding rate. A forward error correction (FEC) block size is maintained at a constant amount. Therefore, as the number of information bits per symbol are increased, an integer multiple of bits per epoch is always maintained. The scheme permits for a greater flexibility and selection of effective data rates providing information bit rates ranging from, for example, approximately 50 kilobits per second to over 5 mega bits per second (Mbps) in one preferred embodiment.

11 Claims, 7 Drawing Sheets

U.S. PATENT DOCUMENTS

| | | | |
|---|---|---|---|
| 4,625,308 A | 11/1986 | Kim et al. | |
| 4,862,453 A | 8/1989 | West et al. | |
| 4,866,709 A | 9/1989 | West et al. | |
| 5,027,348 A | 6/1991 | Curry, Jr. | |
| 5,103,459 A | 4/1992 | Gilhousen et al. | |
| 5,115,309 A | 5/1992 | Hang | |
| 5,128,942 A | 7/1992 | Kojima | |
| 5,161,194 A | 11/1992 | Ujiie | |
| 5,321,725 A | 6/1994 | Paik et al. | |
| 5,341,396 A * | 8/1994 | Higgins et al. | 375/130 |
| 5,394,473 A | 2/1995 | Davidson | |
| 5,440,545 A | 8/1995 | Buchholz et al. | |
| 5,463,403 A | 10/1995 | Walker et al. | |
| 5,487,072 A | 1/1996 | Kant | |
| 5,511,079 A | 4/1996 | Dillon | |
| 5,533,004 A * | 7/1996 | Jasper et al. | 370/204 |
| 5,559,788 A | 9/1996 | Zscheile, Jr. et al. | |
| 5,606,574 A | 2/1997 | Hasegawa et al. | |
| 5,638,384 A | 6/1997 | Hayashi et al. | |
| 5,663,958 A | 9/1997 | Ward | |
| 5,699,364 A | 12/1997 | Sato et al. | |
| 5,699,369 A | 12/1997 | Guha | |
| 5,768,291 A | 6/1998 | Kelton et al. | |
| 5,777,990 A | 7/1998 | Zehavi et al. | |
| 5,781,542 A | 7/1998 | Tanaka et al. | |
| 5,805,567 A | 9/1998 | Ramesh | |
| 5,815,508 A | 9/1998 | Wadzinske et al. | |
| 5,825,807 A | 10/1998 | Kumar | |
| 5,844,918 A | 12/1998 | Kato | |
| 6,141,353 A | 10/2000 | Li | |
| 6,151,332 A | 11/2000 | Gorsuch et al. | |
| 6,157,612 A | 12/2000 | Weerackody et al. | |
| 6,216,244 B1 * | 4/2001 | Myers et al. | 714/746 |
| 6,236,647 B1 | 5/2001 | Amalfitano | |
| 6,269,129 B1 | 7/2001 | Rhee et al. | |
| 6,272,148 B1 | 8/2001 | Takagi et al. | |
| 6,285,681 B1 | 9/2001 | Kolze et al. | |
| 6,310,856 B1 | 10/2001 | Taipale | |
| 6,460,154 B1 | 10/2002 | Duxbury | |
| 6,466,586 B1 | 10/2002 | Darveau et al. | |
| 6,477,669 B1 * | 11/2002 | Agarwal et al. | 714/708 |
| 6,628,667 B1 | 9/2003 | Murai et al. | |
| 6,819,658 B1 | 11/2004 | Agarwal et al. | |
| 6,876,671 B1 | 4/2005 | Rambaud et al. | |
| 6,917,629 B1 * | 7/2005 | Ramesh et al. | 370/509 |
| 7,046,631 B1 | 5/2006 | Giroux et al. | |
| 7,046,653 B2 | 5/2006 | Nigrin et al. | |
| 7,058,077 B1 | 6/2006 | Guo et al. | |
| 7,145,964 B2 | 12/2006 | Hoffmann et al. | |
| 7,593,380 B1 | 9/2009 | Ferguson et al. | |
| 7,826,437 B2 | 11/2010 | Ferguson et al. | |
| 2002/0141520 A1 * | 10/2002 | Nigrin et al. | 375/347 |
| 2004/0128696 A1 | 7/2004 | Bhaskaran et al. | |

FOREIGN PATENT DOCUMENTS

| | | |
|---|---|---|
| EP | 0 635 949 | 7/1994 |
| EP | 0 827 312 | 4/1998 |
| EP | 0 998 069 | 10/1999 |
| FR | 2 266 389 | 10/1975 |
| FR | 2 761 557 | 3/1997 |
| JP | 01-212148 | 8/1989 |
| JP | 04-111554 | 4/1992 |
| JP | 05-327772 | 12/1993 |
| JP | 08-163102 | 6/1996 |
| JP | 08-214043 | 8/1996 |
| JP | 08-265304 | 10/1996 |
| JP | 09-083603 | 3/1997 |
| JP | 09-139727 | 5/1997 |
| JP | 10-022937 | 1/1998 |
| JP | 10-107993 | 4/1998 |
| JP | 10-145341 | 5/1998 |
| WO | 96/13914 | 5/1996 |
| WO | 98/19481 | 5/1998 |
| WO | 98/43373 | 10/1998 |
| WO | 98/59447 | 12/1998 |
| WO | 99/44341 | 2/1999 |
| WO | 99/14878 | 3/1999 |
| WO | 99/39472 | 8/1999 |
| WO | 99/41872 | 8/1999 |
| WO | 99/44341 | 9/1999 |
| WO | 99/45660 | 9/1999 |
| WO | 00/52831 | 9/2000 |
| WO | 00/65764 | 11/2000 |
| WO | 00/72496 | 11/2000 |

OTHER PUBLICATIONS

Hanzo, L. et al. "Burst-By-Burst Adaptive Wideband Wireless Video Telephony", *Communications and Vehicular Technology*: 215-232 (2000).

Hagenauer, J. "Rate-Compatible Punctured Convolutional Codes (RCPD Codes) and their Applications," *IEEE Transactions on Communications*, 36(4): 389-400 (Apr. 1998).

Lin, S. et al. "Automatic-Repeat-Request Error-Control Schemes," *IEEE Communications Magazine*, 22(12): 5-17 (Dec. 1984).

Shacham, N., "A Selective-Repeat-ARQ Protocol for Parallel Channels and Its Resequencing Analysis," *IEEE Transactions on Communications*, 40(4): 773-782 (Apr. 1992).

Rupar, M. et al., "Satellite VSAT Networking Using CDMA," *AIAA-98-5128*, Oct. 29, 1998, pp. 1-6.

Hagenauer, J., "Rate-Compatible Punctured Convolution Codes (RCPC Codes) and their Applications," IEEE Transactions on Communications, 36(4): 389-400 (Apr. 1988).

Hanzo et al., Burst-By-Burst Adaptive Wideband Wireless Video Telephony,: Communications and Vehicular: 215-232 (2000).

Lin et al., "Automatic-Repeat-Request-Error-Control Schemes," IEEE Communications Magazine, 22(12): 5-17 (Dec. 1984).

Rupar et al., "Satellite VSAT Networking Using CDMA," AIAA-98-5128, pp. 1-6 (Oct. 1998).

TIA/EIA Interim Standard, Mobile Station-Base Station Compatibility Standard for Dual-Mode Wideband Spread Spectrum Cellular System, TIA/EIA/IS-95-A (Revision of TIA/EIA/IS-95) (May 1995).

TIA/EIA Standard, Mobile Station-Base Station Compatibility Standard for Wideband Spread Spectrum Cellular Systems, TIA/EIA-95-B (Upgrade and Revision of TIA/EIA-95-A) (Mar. 1999).

Wang et al., "Spread Spectrum Multiple-Access with DPSK Modulation and Diversity for Image Transmission over Indoor Radio Multipath Fading Channels," IEEE, pp. 200-214 (1996).

Rupar, M. et al., "Satellite VSAT Networking Using CDMA," *AIAA-985128*, Oct. 29, 1998, pp. 1-6.

Shacham, N., "A Selective-Repeat-ARQ Protocol for Parallel Channels and Its Resequencing Analysis," *IEEE Transaction on Communications*, 40(4): 773-782 (Apr. 1992).

Ericsson, "EDGE: Concept Proposal for Enhanced GPRS," ETSI SMG2 Working Session on EDGE, TDoc SMG2 EDGE 006/99 (Mar. 2-4, 1999).

* cited by examiner

| MOD INFO SIZE | 64 3249 4096 | 64 2048 4096 | 64 1331 4096 | 16 3249 4096 | 16 2048 4096 | 16 1331 4096 | 8 3249 4096 | 8 2048 4096 | 8 1331 4096 | 4 3249 4096 | 4 2048 4096 | 4 1331 4096 |
|---|---|---|---|---|---|---|---|---|---|---|---|---|
| CHANNEL CODES | | | | | | | | | | | | |
| 2 | 0.366 | 0.228 | 0.150 | 0.244 | 0.152 | 0.100 | 0.183 | 0.114 | 0.075 | 0.122 | 0.076 | 0.050 |
| 4 | 0.731 | 0.456 | 0.299 | 0.487 | 0.304 | 0.200 | 0.366 | 0.228 | 0.150 | 0.244 | 0.152 | 0.100 |
| 6 | 1.097 | 0.684 | 0.449 | 0.731 | 0.456 | 0.299 | 0.548 | 0.342 | 0.225 | 0.366 | 0.228 | 0.150 |
| 8 | 1.462 | 0.913 | 0.599 | 0.975 | 0.608 | 0.399 | 0.731 | 0.456 | 0.299 | 0.487 | 0.304 | 0.200 |
| 10 | 1.828 | 1.141 | 0.749 | 1.218 | 0.761 | 0.499 | 0.914 | 0.570 | 0.374 | 0.609 | 0.380 | 0.250 |
| 12 | 2.193 | 1.369 | 0.898 | 1.462 | 0.913 | 0.599 | 1.097 | 0.684 | 0.449 | 0.731 | 0.456 | 0.299 |
| 14 | 2.559 | 1.597 | 1.048 | 1.706 | 1.065 | 0.699 | 1.279 | 0.799 | 0.524 | 0.853 | 0.532 | 0.349 |
| 16 | 2.924 | 1.825 | 1.198 | 1.949 | 1.217 | 0.799 | 1.462 | 0.913 | 0.599 | 0.975 | 0.608 | 0.399 |
| 18 | 3.290 | 2.053 | 1.348 | 2.193 | 1.369 | 0.898 | 1.645 | 1.027 | 0.674 | 1.097 | 0.684 | 0.449 |
| 20 | 3.655 | 2.282 | 1.497 | 2.437 | 1.521 | 0.998 | 1.828 | 1.141 | 0.749 | 1.218 | 0.761 | 0.499 |
| 22 | 4.021 | 2.510 | 1.647 | 2.680 | 1.673 | 1.098 | 2.010 | 1.255 | 0.824 | 1.340 | 0.837 | 0.549 |
| 24 | 4.386 | 2.738 | 1.797 | 2.924 | 1.825 | 1.198 | 2.193 | 1.369 | 0.898 | 1.462 | 0.913 | 0.599 |
| 26 | 4.752 | 2.966 | 1.947 | 3.168 | 1.977 | 1.298 | 2.376 | 1.483 | 0.973 | 1.584 | 0.989 | 0.649 |
| 28 | 5.117 | 3.194 | 2.096 | 3.411 | 2.129 | 1.398 | 2.559 | 1.597 | 1.048 | 1.706 | 1.065 | 0.699 |

FIG. 5

| MOD | 64 | 64 | 64 | 16 | 16 | 16 | 8 | 8 | 8 | 4 | 4 | 4 |
|---|---|---|---|---|---|---|---|---|---|---|---|---|
| TPC SIZE | 1482 | 858 | 684 | 1482 | 858 | 684 | 1482 | 858 | 684 | 1482 | 858 | 684 |
| RATE | 2048 | 2048 | 2048 | 2048 | 2048 | 2048 | 2048 | 2048 | 2048 | 2048 | 2048 | 2048 |
| CODES | | | | | | | | | | | | |
| 2 | 0.333 | 0.193 | 0.154 | 0.222 | 0.129 | 0.103 | 0.167 | 0.097 | 0.077 | 0.111 | 0.064 | 0.051 |
| 4 | 0.667 | 0.386 | 0.308 | 0.445 | 0.257 | 0.205 | 0.333 | 0.193 | 0.154 | 0.222 | 0.129 | 0.103 |
| 6 | 1.000 | 0.579 | 0.462 | 0.667 | 0.386 | 0.308 | 0.500 | 0.290 | 0.231 | 0.333 | 0.193 | 0.154 |
| 8 | 1.334 | 0.772 | 0.616 | 0.889 | 0.515 | 0.410 | 0.667 | 0.386 | 0.308 | 0.445 | 0.257 | 0.205 |
| 10 | 1.667 | 0.965 | 0.770 | 1.112 | 0.644 | 0.513 | 0.834 | 0.483 | 0.385 | 0.556 | 0.322 | 0.257 |
| 12 | 2.001 | 1.158 | 0.923 | 1.334 | 0.772 | 0.616 | 1.000 | 0.579 | 0.462 | 0.667 | 0.386 | 0.308 |
| 14 | 2.334 | 1.351 | 1.077 | 1.556 | 0.901 | 0.718 | 1.167 | 0.676 | 0.539 | 0.778 | 0.450 | 0.359 |
| 16 | 2.668 | 1.544 | 1.231 | 1.778 | 1.030 | 0.821 | 1.334 | 0.772 | 0.616 | 0.889 | 0.515 | 0.410 |
| 18 | 3.001 | 1.737 | 1.385 | 2.001 | 1.158 | 0.923 | 1.501 | 0.869 | 0.693 | 1.000 | 0.579 | 0.462 |
| 20 | 3.335 | 1.931 | 1.539 | 2.223 | 1.287 | 1.026 | 1.667 | 0.965 | 0.770 | 1.112 | 0.644 | 0.513 |
| 22 | 3.668 | 2.124 | 1.693 | 2.445 | 1.416 | 1.129 | 1.834 | 1.062 | 0.846 | 1.223 | 0.708 | 0.564 |
| 24 | 4.001 | 2.317 | 1.847 | 2.668 | 1.544 | 1.231 | 2.001 | 1.158 | 0.923 | 1.334 | 0.772 | 0.616 |
| 26 | 4.335 | 2.510 | 2.001 | 2.890 | 1.673 | 1.334 | 2.167 | 1.255 | 1.000 | 1.445 | 0.837 | 0.667 |
| 28 | 4.668 | 2.703 | 2.155 | 3.112 | 1.802 | 1.436 | 2.334 | 1.351 | 1.077 | 1.556 | 0.901 | 0.718 |

FIG. 6

| MOD<br>INFO<br>SIZE | 64<br>676<br>1024 | 64<br>363<br>1024 | 16<br>676<br>1024 | 16<br>363<br>1024 | 8<br>676<br>1024 | 8<br>363<br>1024 | 4<br>676<br>1024 | 4<br>363<br>1024 |
|---|---|---|---|---|---|---|---|---|
| CODES | | | | | | | | |
| 2 | 0.304 | 0.163 | 0.203 | 0.109 | 0.152 | 0.082 | 0.101 | 0.054 |
| 4 | 0.608 | 0.327 | 0.406 | 0.218 | 0.304 | 0.163 | 0.203 | 0.109 |
| 6 | 0.913 | 0.490 | 0.608 | 0.327 | 0.456 | 0.245 | 0.304 | 0.163 |
| 8 | 1.217 | 0.653 | 0.811 | 0.436 | 0.608 | 0.327 | 0.406 | 0.218 |
| 10 | 1.521 | 0.817 | 1.014 | 0.545 | 0.761 | 0.408 | 0.507 | 0.272 |
| 12 | 1.825 | 0.980 | 1.217 | 0.653 | 0.913 | 0.490 | 0.608 | 0.327 |
| 14 | 2.129 | 1.143 | 1.420 | 0.762 | 1.065 | 0.572 | 0.710 | 0.381 |
| 16 | 2.434 | 1.307 | 1.622 | 0.871 | 1.217 | 0.653 | 0.811 | 0.436 |
| 18 | 2.738 | 1.470 | 1.825 | 0.980 | 1.369 | 0.735 | 0.913 | 0.490 |
| 20 | 3.042 | 1.634 | 2.028 | 1.089 | 1.521 | 0.817 | 1.014 | 0.545 |
| 22 | 3.346 | 1.797 | 2.231 | 1.198 | 1.673 | 0.898 | 1.115 | 0.599 |
| 24 | 3.650 | 1.960 | 2.434 | 1.307 | 1.825 | 0.980 | 1.217 | 0.653 |
| 26 | 3.955 | 2.124 | 2.636 | 1.416 | 1.977 | 1.062 | 1.318 | 0.708 |
| 28 | 4.259 | 2.287 | 2.839 | 1.525 | 2.129 | 1.143 | 1.420 | 0.762 |

FIG. 7

SUBSCRIBER UNIT AND METHOD FOR VARIABLE FORWARD ERROR CORRECTION (FEC) DECODING

CROSS REFERENCE TO RELATED APPLICATIONS

This application is a continuation of U.S. patent application Ser. No. 11/633,970 filed Dec. 5, 2006, and issued as U.S. Pat. No. 7,502,424 on Mar. 10, 2009; which is a continuation of U.S. patent application Ser. No. 11/264,847 filed Nov. 2, 2005, which issued as U.S. Pat. No. 7,145,964 on Dec. 5, 2006; which is a continuation of U.S. patent application Ser. No. 09/773,253 filed Jan. 31, 2001, which issued as U.S. Pat. No. 6,973,140 on Dec. 6, 2005; which is a continuation-in-part of U.S. patent application Ser. No. 09/447,022 filed Nov. 22, 1999, which issued as U.S. Pat. No. 6,785,323 on Aug. 31, 2004; which is a continuation-in-part of U.S. patent application Ser. No. 09/263,358 filed Mar. 5, 1999, and issued as U.S. Pat. No. 7,593,380 on Sep. 22, 2009, which are incorporated by reference as if fully set forth.

FIELD OF INVENTION

This application is related to wireless communications, and more particularly to a technique for providing variable data rate connections over digitally encoded radio channels.

BACKGROUND

The widespread availability of personal computers at low cost has led to a situation where the public demands access to the Internet and other computer networks at the lowest possible cost. This demand is being expanded to include network access for portable devices such as laptop computers, Personal Digital Assistants, and the like. Users of such portable devices even now expect to be able to access such computer networks with the same convenience that they have grown accustomed to when using wire line connections.

Unfortunately, there is still no widely available satisfactory solution for providing low cost wireless access to the Internet at high speed. At the present time, the users of wireless modems that operate with the existing digital cellular telephone network often experience a difficult time when trying to, for example, view Web pages. The existing digital cellular telephone network may use schemes such as Code Division Multiple Access (CDMA) to permit multiple users to operate on the same Radio Frequency (RF) physical layer channel at the same time, such as in the IS-95B standard which is popular in the United States. In this approach, each traffic signal is first encoded with a pseudorandom (PN) code sequence at the transmitter. The receivers include equipment to perform a PN decoding function in such a way that signals encoded with different PN code sequences or with different code phases can be separated from one another. Because PN codes in and of themselves do not provide perfect separation of the channels, these systems have an additional layer of coding, referred to as "orthogonal codes." The orthogonal codes further reduce interference between channels.

However, the higher layer communication protocols in such networks were originally designed to support voice communication and not the packet-oriented data communication protocols used for connecting users of wide area networks do not lend themselves to efficient transmission over wireless interfaces.

Certain other CDMA systems have been proposed that more efficiently support data communications using multiple connections over a given Radio Frequency (RF) channel. One example of such a system was described in U.S. Pat. No. 6,151,332 entitled "A Protocol Conversion and Bandwidth Reduction Technique Providing Multiple nB+D ISDN Basic Rate Interface Links Over a Wireless Code Division Multiple Access Communication System," and assigned to Tantivy Communications, Inc., the assignee of the present application. With such techniques, higher speed throughput can be provided by a more efficient allocation of access to the CDMA channels. In particular, a number of sub-channels are defined within a standard CDMA channel bandwidth, such as by assigning a different code to each sub-channel. The instantaneous bandwidth needs of a given connection are then met by dynamically allocating multiple sub-channels on an as-needed basis for each session. For example, sub-channels can be granted during times when the subscriber bandwidth requirements are relatively high, such as when downloading Web pages. The sub-channels are then released during times when the content is relatively light, such as when the user is reading a previously downloaded Web page.

However, to implement such a system requires careful planning of various modulation and coding schemes in order to accomplish the maximum possible bit rate while minimizing the effects of noise, multi-path distortion, and other sources of errors. For example, modulation codes and pseudorandom spreading codes must be carefully selected to minimize interference among channels occupying the same radio frequency carrier. In addition, it is necessary for framing bits to be inserted in data streams so that higher layered data protocols such as Transmission Control Protocol/Internet Protocol (TCP/IP) can be efficiently implemented.

Furthermore, in order for the PN and orthogonal code properties to operate properly at a receiver, certain other design considerations must be taken into account. For signals traveling in a reverse link direction, that is, from a mobile unit back to a central base station, power levels must be carefully controlled. In particular, the orthogonal properties of the codes are optimized for the situation where individual signals arrive at the receiver with approximately the same power level. If they do not, channel interference increases.

The forward link direction presents a different problem. A signal traveling from the base station to a subscriber unit may interfere with another signal in an unpredictable way as a result of the so-called near-far problem. For example, far away mobile units require relatively high power in order to be detected properly whereas close-in mobile units require lower power. The stronger signals may interfere with proper operation of mobile units located closer to the base station which typically to operate with lower power levels. Unfortunately, this behavior depends upon the specific operating environment of the mobile communications system, including the topology of the surrounding geography, the juxtaposition of the subscriber units with respect to one another, and other factors.

In the past, with voice-based systems such as IS-95, it has been possible to set power levels individually to optimize each forward link channel so that interference is minimized. With these systems, since the information bandwidth remains constant, a transmitted power level can be continuously adjusted in a closed-loop fashion to affect an optimum received power level at the subscriber unit which tends to minimize interference.

SUMMARY

While the above-mentioned systems work well in relatively noise-free environments, they are not optimal in certain respects.

Certain techniques known as forward error correction (FEC) are generally used with CDMA and other multiple access modulation schemes applied to voice transmission. Such techniques accept a group of bits, or a "block," to be sent over a wireless channel and then, according to sophisticated mathematical algorithms, determine values for additional redundant bits. The number of redundant bits may be quite significant. For example, it is common to use so-called one-half rate, one-third rate, or even one-quarter rate codes whereby the number of bits in a block actually transmitted increases by a factor of two, three, or four respectively.

The forward error correcting code can therefore be used to not only detect that a particular string of bits has been received in error, but also to implement error correction. This eliminates the need to retransmit an entire packet due to an error in one or more bits. Forward error correction has thus been widely used in implementations such as satellite broadcast where retransmission is impractical and/or expensive.

Unfortunately, implementation of forward error correction leads to transmitting fewer information bits per packet. In addition, the need to obtain the best error performance typically dictates that a relatively large block size be used for the highest performance algorithms. Implementation of such error correction algorithms therefore incurs latencies in that the entire block must be available at the receiver before it can be decoded. In addition, if an error is detected which cannot be recovered through the forward error correction process, additional latencies are incurred while the block is retransmitted.

The present invention is a protocol converter disposed between a physical communication layer, as may be associated with implementing a wireless communication protocol, and a network layer, as may be associated with implementing a network communications protocol.

In the preferred embodiment, the protocol converter on the transmitter side first splits a network layer frame, such as a TCP/IP frame, into smaller portions referred to as segments. The segment size may be variable in length according to an observed error rate. At this point, the segments are then arranged into groups referred to herein as blocks.

A forward error correction (FEC) algorithm is then applied to the block as a whole. The rate of the FEC algorithm applied may be selected from a number of available rates, based upon observed channel conditions.

The block size and FEC code rate are selected to provide a predetermined number of bits per encoded block. For example, the FEC code may be a one-third, a one-half, or a four-fifths rate error correction code for coded blocks of 4096 or 2048 bits. For coded block sizes of 1024 bits, the code rates may be one-third or two-third rate codes.

A symbol modulation process is then applied to the FEC encoded block. In the preferred embodiment, Quadrature Amplitude Modulation (QAM) is applied with the available symbol encoding rates being selected from 4, 8, 16, or 64 bits per symbol. These symbol encoding rates implement Quadrature Phase Shift Keyed (QPSK), 8-Level Phase Shift Keyed (8-PSK), 16-level Quadrature Amplitude Modulation (16 QAM) or 64 QAM, respectively.

The protocol also preferably makes use of multiple physical layer connections referred to herein as sub-channels to transmit the encoded symbol blocks at an overall desired transmission rate. Thus, the symbol modulated block is split among the allocated sub-channels such as on a symbol by symbol basis. The symbols comprising the block are then sent over the sub-channels by further modulating the symbols with a pseudonoise (PN) spreading code and a channel code for each sub-channel. The sub-channels are preferably allocated in pairs. This permits the number of bits transmitted per PN epoch to remain a power of two, which simplifies system design.

On the receiver side, a receive protocol converter performs the inverse function. Symbols received over the various wireless sub-channels are first assembled into a received block. The received symbol block is decoded into bits, and then presented to the inverse FEC algorithm to strip off the redundant code bits and perform error correction. The output of the FEC decoding process is then assembled into the required network layer frames.

This invention provides an additional degree of freedom to the system manager process by permitting individual traffic channel data rates to adapt to specific channel conditions on the fly. For example, an optimum forward error correction (FEC) coding rate may be selected as well as an optimum modulation type for observed conditions in the individual channels.

A fixed number of FEC symbols is thus maintained per transmitted frame, independent of FEC coding rates, power levels, and symbol modulation type. This allows different FEC rates, symbol rates, and/or different FEC codes to be assigned to each user channel depending upon channel conditions, without changing the effective transmitted power levels.

For example, if one channel is experiencing relatively good propagation conditions, the FEC coding rate and/or the number of symbols may be increased per FEC frame without changing transmit power levels. Because the overall information rates depend upon the ratio of the raw data rate divided by the FEC code rate times the symbol coding rate, a higher overall information rate is obtained without producing greater interference to the operation of other channels.

On the other hand, if a particular channel is in a relatively bad or marginal transmission environment, steps can be taken to reduce the overall information rate. Specifically, the effective FEC coding rate can be increased and/or the number of symbols reduced thereby reducing the effective number of input bits per FEC frame. This permits the channel to become more robust without increasing the transmit power level.

In a preferred embodiment, the receiver is notified of the FEC coding rate, symbol modulation rate and other channel parameters by periodically sending a message to the intended receiver to indicate the coding rate and symbol rates to be used in future transmissions for a given channel. In a typical cellular radio communication and implementation such rate messages may be sent on a forward link paging channel, a reverse link access channel, or a synchronization channel directed to a particular receiver.

The invention is particularly advantageous in an environment which uses packet-oriented protocols such as TCP/IP. Because the number of channels needed to carry a single data stream can be varied efficiently, burst rates can also be efficiently adapted.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 5 is a chart of information bits rates for different available sub-channels, forward error correction (FEC) rates, and symbol rates given a 4096 block size;

FIG. 6 is a similar chart for a 2048 block size; and

FIG. 7 is a similar chart for a 1024 block size.

DETAILED DESCRIPTION

When referred to hereafter, the terminology "wireless transmit/receive unit (WTRU)" includes but is not limited to a user equipment (UE), a mobile station, a fixed or mobile subscriber unit, a pager, a cellular telephone, a personal digital assistant (PDA), a computer, or any other type of user device capable of operating in a wireless environment. When referred to hereafter, the terminology "base station" includes but is not limited to a Node-B, a site controller, an access point (AP), or any other type of interfacing device capable of operating in a wireless environment.

Figure 1:
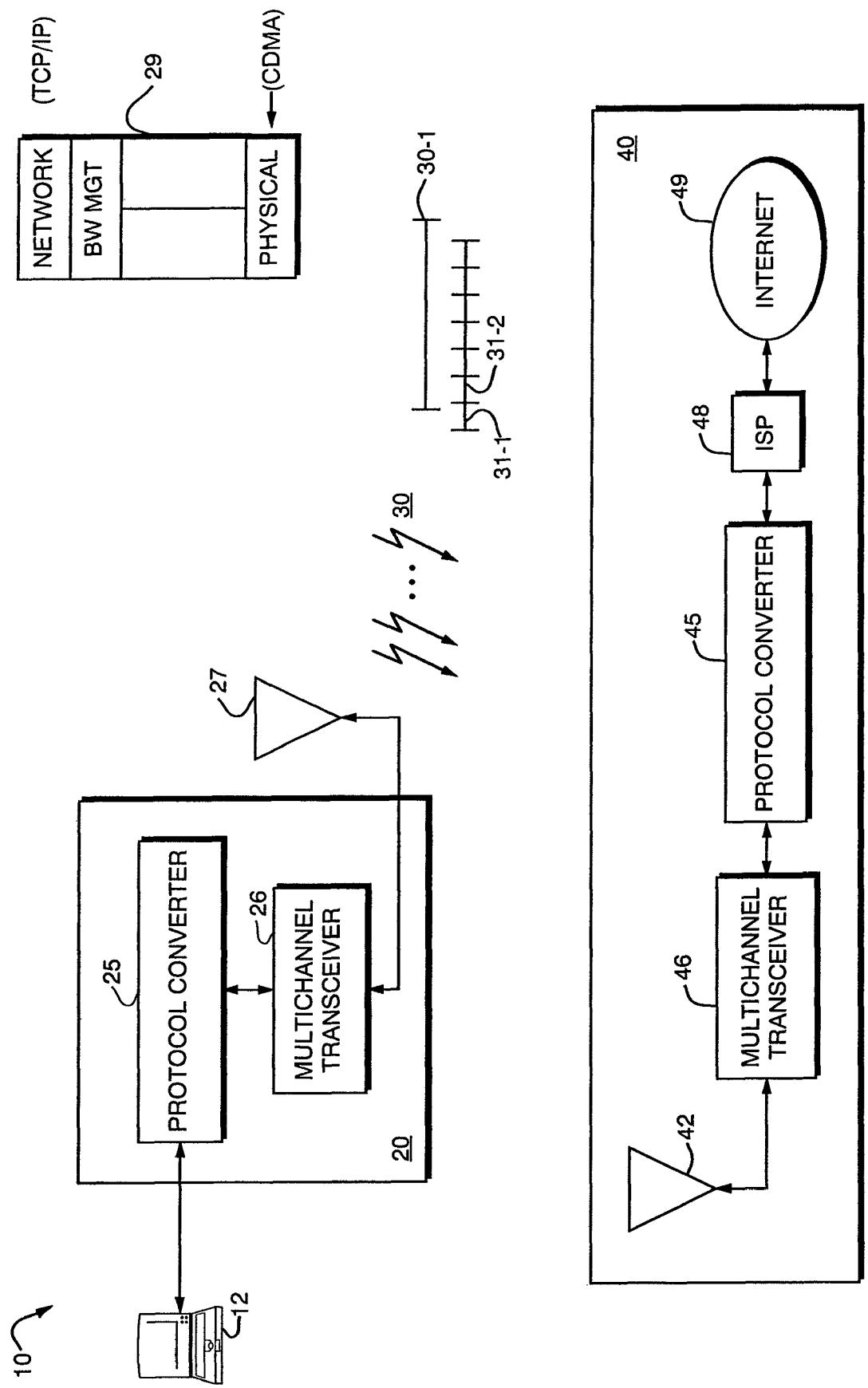
FIG. 1 is a block diagram of a system in which a portable data processing device uses a protocol converter according to the invention to connect to a wireless network.

Turning attention now to the drawings more particularly, FIG. 1 is a block diagram of a system 10 for providing high speed data communication service according to the invention. The system 10 consists of a remote subscriber unit 20, multiple bidirectional communication links 30, and a central or local service provider unit 40.

The subscriber unit connects to terminal equipment 12, such as a portable or laptop computer, hand held Personal Digital Assistant (PDA), or the like. The subscriber unit 20 includes a protocol converter 25 which provides data to a multi-channel digital transceiver 26 which in turn connects to a subscriber unit antenna 27.

The protocol converter 25 receives data from the computer 20, and together with appropriate hardware and/or software, converts it to a format suitable for transmission such as in accordance with known communication standards. The protocol converter 25 implements an intermediate protocol layer that coverts the data to a format appropriate for use by the multi-channel transceiver 26 according to the invention. As will be described in much greater detail below, at a network layer, the data provided by the protocol converter 25 to the terminal equipment 12 is preferably formatted in a manner consistent with suitable network communication protocols, such as TCP/IP, to permit the terminal equipment 12 to connect to other computers over networks such as the Internet. This description of the protocol converter 25 and protocols is exemplary only and it should be understood that other network layer protocols can be used.

The multi-channel digital transceiver 26 provides access to one or more physical communication links such as the illustrated radio channels 30. The physical links are preferably further encoded using known digital multiplexing techniques such as Code Division Multiple Access (CDMA) to provide multiple traffic on a given radio channel 30 or sub-channels 31. It should be understood that other wireless communication protocols may also be used to advantage with the invention.

The communications channels may be implemented by providing multiple coded sub-channels 31 on a single wide bandwidth CDMA carrier channel 30 such as having a 1.25 MegaHertz (MHz) bandwidth. The individual channels are then defined by unique CDMA codes. Alternatively, the multiple channels 31 may be provided by single channel physical communication media such as provided by other wireless communication protocols. What is important is that the sub-channels 31 may be adversely affected by significant bit error rates that are unique to each radio channel 30.

The service provider equipment 40 includes an antenna 42, a multi-channel transceiver 46, a protocol converter 45, and other interface equipment 48 such as modems, bridges, gateways, routers, and the like, which are needed to provide connections to the Internet 49 or other networks.

At the service provider 40, the multi-channel transceiver 46 provides functions analogous to the multi-channel transceiver 26 of the subscriber unit, but in an inverse fashion. The same is true of the protocol converter 45, that is, it provides inverse functionality to the protocol converter 25 in the subscriber unit 20. Data is accepted from the protocol converter 45 in the TCP/IP frame format and then communicated to the Internet 49. It should be understood that the configuration of the remaining equipment 40 may take any number of forms such as local area networks, multiple dial up connections, Ti carrier connection equipment, or other high speed communication links to the Internet 49.

Turning attention now to the protocol converters 25 and 45 more particularly, 20 they provide bandwidth management functionality 29 implemented between a physical layer such as provided by the CDMA protocol in use with the multi-channel transceivers 26 and a network layer protocol such as TCP/IP providing connections between the terminal equipment 22 and the network 49.

The bandwidth management function 29 performs a number of tasks in order to 25 keep both the physical layer and network layer connections properly maintained over multiple communication links 30. For example, certain physical layer connections may expect to receive a continuous stream of synchronous data bits regardless of whether terminal equipment at either end actually has data to transmit. Such functions may also include rate adaption, bonding of multiple channels on the links, spoofing, radio channel setup and tear-down. The details for implementing a protocol converter specifically for ISDN terminal equipment 12 and Code Division Multiple Access (CDMA) modulation techniques in use by the multi-channel transceiver 26 are more specifically described in the aforementioned issued U.S. Pat. No. 6,151, 332.

The present invention is more particularly concerned with the techniques used by the protocol converters 25 and 45 for formatting the data to be transmitted over multiple logical sub-channels 31-1, 31-2, . . . , 31-n. It should be understood in the following discussion that the connections discussed herein are bidirectional, and that a "transmitter" may either be the subscriber unit 22 or the service provider unit 40.

Figure 2:
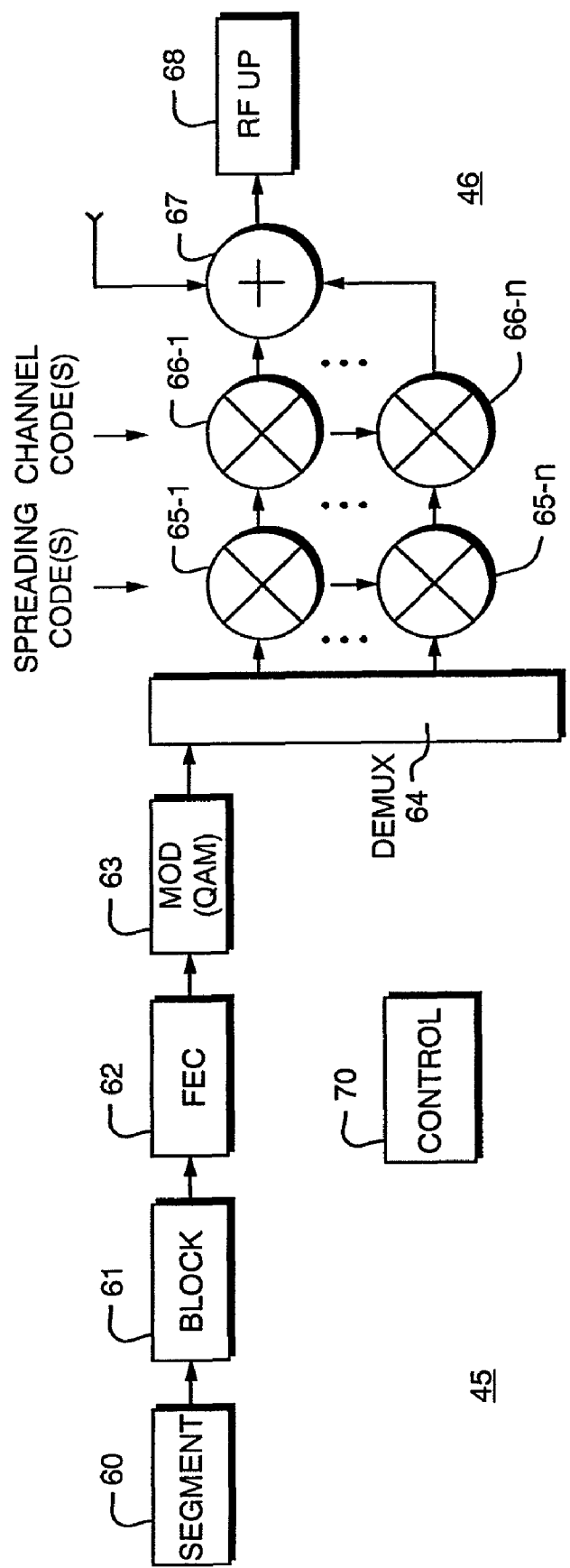
FIG. 2 is a detailed diagram depicting the architecture of the protocol converter and multi-channel transmitter for a forward link.

Turning attention now to FIG. 2, there is shown a more detailed block diagram of a transmitter portion implemented according to the invention. More particularly, what is illustrated is the transmitter for the forward link including the protocol converter 45 and multi-channel transceiver 46 associated with the service provider 40.

As can be seen from the diagram, the protocol converter 45 includes a segmenter 60, block coder 61, Forward Error Correction (FEC) coder 62, and symbol modulator 63. Multi-channel transceiver 46 includes a demultiplexer 64 plus a number of channel modulators including at least one spreading code modulator 65 and channel code modulator 66. It should be understood that there may be a number of spreading code 20 modulators 65-1, . . . 65-n, and a-corresponding number of channel code modulators 66-1, . . . 66-n, depending upon the number of CDMA sub-channels 31-1, . . . 31-n, being assigned to a particular forward link connection. The spreading code modulators 65 preferably apply a pseudonoise (PN) spreading code at a desired chipping rate. The channel code modulators 66 further apply a unique orthogonal or PN code to define each CDMA sub-channel. In the preferred embodiment, the coding rate is 1.2288 Mega-chips per second with 32 chips per input bit. A summer 67 adds the various channel signals together. At this point, additional logical channels such as pilot channels and paging channels may be added to the data channels before all such channels are fed to a Radio Frequency (RF) up converter 68.

The controller 70 provides signals that control the operation of the segmenter 60, block encoder 61, FEC encoder 62, symbol modulator 63, demultiplexer 64, as well as the allocation of spreading code modulators 65 and channel code modulators 66. Specifically, the system may change the number of bits per block, as applied by the block encoder 61, may change the particular rate used for error correction coding as applied by FEC block 62, may change the specific number of bits per symbol implemented by the symbol modulator 63, and may change the number of spreading code modulators 65 and channel code modulators 66 allocated to a particular connection. It is the flexibility in assigning these various parameters that provides for a number of degrees of freedom in determining the forward link capacity for specific connections.

The overall information rate can be represented by the expression shown in FIG. 2. This is the ratio of the chip rate divided by the number of chips per symbol times the number of bits per symbol used in the symbol modulator 63, number of code words per connection as implemented by the number of channel codes implemented by the channel coders 66, and the ratio of the information block size divided by the FEC block size as implemented by the block encoder 61 and FEC encoder 62.

Figure 3:
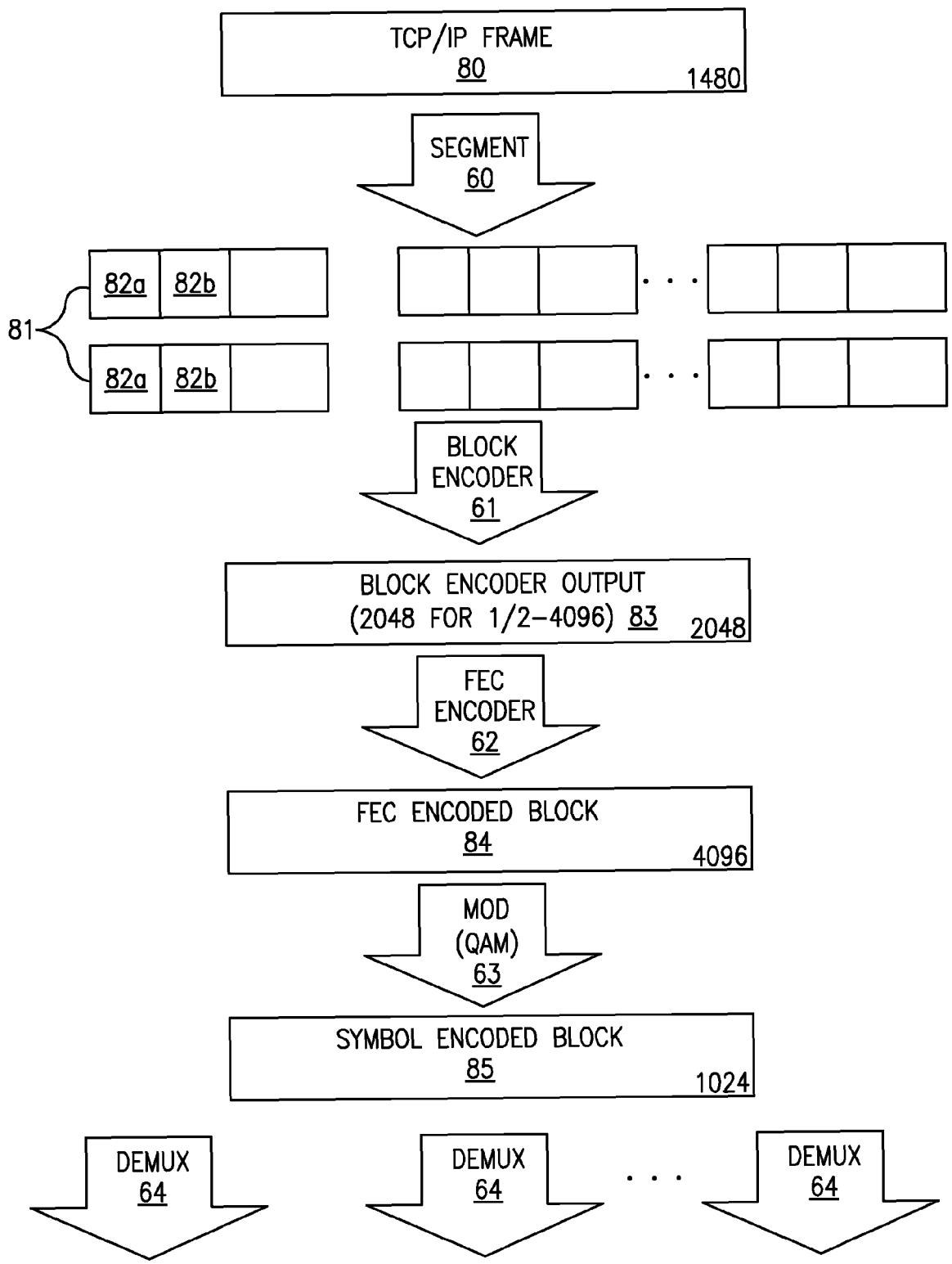
FIG. 3 is a diagram illustrating how network layer frames are encoded into symbol blocks at a transmitter.

Continuing now to refer to FIG. 2 in connection with the diagram of FIG. 3, input data is first received such as in the form of a high-level network layer frame. Specifically, the input network layer frame 80 may be a group of 1480 data bits in the format of a Transmission Control Protocol/Internet Protocol (TCP/IP) frame. The frame segmenter 60 reformats the TCP/IP frame, dividing it in the preferred embodiment into a number of individual segments 81. The size of the individual segments 81 is chosen based upon an optimum segment length determined for each of the radio channels 30. For example, a bandwidth management function 29 may only make available a certain number of sub-channels 31 to each network layer connection at a given time. The optimum number of bits per each segment intended to be transmitted over the respective sub-channels is then chosen. Parameters such as the frame overhead, shared frame segmentization flags between frames and sub-frame error ratio may be used in determining the segment size. For more information on the selection of a particular size for a given segment 81, reference is made to the above-referenced application Ser. No. 09/263,358 filed on Mar. 5, 1999, now U.S. Pat. No. 7,593,380, entitled "Forward Error Correction on Multiplexed CDMA Channels".

After the input frame 80 is divided into segments 81 by the segmenter 60, each of the segments 81 typically has additional information appended to it. For example, each of the segments 81 may have a position identifier 82A and an integrity check sum such as in the form of a Cyclic Redundancy Check (CRC) 82B. The position identifier 82A serves to indicate the position of each segment within its associated larger frame 80. Because the data bits are ultimately going to be potentially split and sent among a number of different radio communication channels, the integrity check serves to permit the receiver to determine whether each particular segment has been received correctly or in error and then subsequently request retransmission of only the segment 81 received in error rather than the entire TCP/IP frame 80.

In any event, regardless of whether or not or how the segmentation process takes place the bits are then further prepared for transmission over each sub-channel 31.

In a next step, the segments 81 are fed to the block encoder 61. The block encoder 61 groups the bits into a predetermined block size. The block size depends upon ultimately the desired number of bits per Forward Error Correction (FEC) block output by FEC encoder 62. In particular, in the example being described the number of bits desired to be output by the FEC encoder 62, each block is 4096. In the example being described, the FEC algorithm being implemented is a one-half rate encoder. Thus, the block encoder 61 will first output a group of 2048 bits.

Next, the desired FEC algorithm is applied to the block by FEC encoder 62. The FEC encoder applies the desired algorithm outputting the FEC encoded block 84. In the example being described, this FEC encoded block consists of 4096 bits. In a case where a one-third rate FEC code is chosen, the block encoder selects 1331 bits; however, the FEC encoded block will still be 4096 bits long.

The FEC encoded block is then fed to the symbol modulator 63. The symbol modulator 63 groups the bits according to a number of bits per symbol. In the illustrated embodiment, symbol encoding is 4 bits per symbol, i.e., the modulation type selected is Quadrature Phase Shift Keyed (QPSK). Thus, the symbol encoded block 85 consists of 1024 symbols, each symbol having one of four different values that specify a phase.

Finally, the symbols are then allocated among a number of code channels. In the illustrated embodiment, the number of code channels assigned to the particular connection is n. The demultiplexer 64 thus divides the stream of symbols from the modulator 63 into n separate symbol streams, each of which is applied to one of the code channels. It should be understood that the order of the symbol modulator 63 and demultiplexer 64 may be reversed; e.g., the demultiplexer 64 may operate on the FEC coder 62 output, and such output may be fed to n symbol modulator 63. Each respective one of the code channels then has applied to it its assigned spreading code 65-1 and channel code 66-1, as previously described.

A bandwidth management function associated with the centrally located base station equipment 40 determines how many channels to be allocated to each connection. In the case of the present invention; this bandwidth management function 29 also sets the values for the block size, FEC code rate and symbol rate information needed, respectively, by the block encoder 61, FEC encoder 62, and symbol encoder 63. This information may be further fed from the bandwidth management function 29 down to a controller 68 which distributes such information to these blocks. A similar controller 90 in the receiver also obtains information concerning the specific number of channels, n, symbol rate, FEC coding rate, and block size associated with each connection. Such information may be provided by the bandwidth management function 29 in response to observed conditions in the assigned channels. These adjustments may be made, for example, in response to determining a signal strength value which may be done by measuring a ratio of the energy per data bit divided by a normalized noise power level (Eb/No) at the receiver. The receiver can therefore periodically measure such normalized noise power level and make a report of such level back to the central base station 40.

For example, if a remote access unit 20 is located deep inside of a building it may be experiencing particularly adverse multi-path or other distortion conditions. In the past it was thought necessary to increase the power level of the individual signals 31 in order to obtain an appropriate receive signal level from the access unit 20. However, with the invention, if a full maximum data rate is not needed, then the FEC coding rate implemented by the FEC encoder 62 can be increased and/or the symbol rate implemented by the symbol encoder 63 can be lowered, either or both will result in improved performance.

In other environments, where multi-path distortion is minimal, such as in a direct line of sight situation, the highest rate for the symbol encoder 63 may be selected. In addition the highest FEC rate, i.e., the most number of data bits per FEC encoded symbol may be selected by the FEC encoder 62. These can furthermore be selected while at the same time reducing the radiated power level on the forward link for that particular channel. This therefore maximizes the available data rate for a given user while also minimizing the interference generated to other users of the same radio channel.

Thus, in environments where radio propagation is good, the system can then increase the data rate to a given user on the forward link without introducing additional interference to other users. However, in a bad signaling environment, an advantage is also obtained since each particular user channel can be made robust without increasing its power level.

Figure 4:
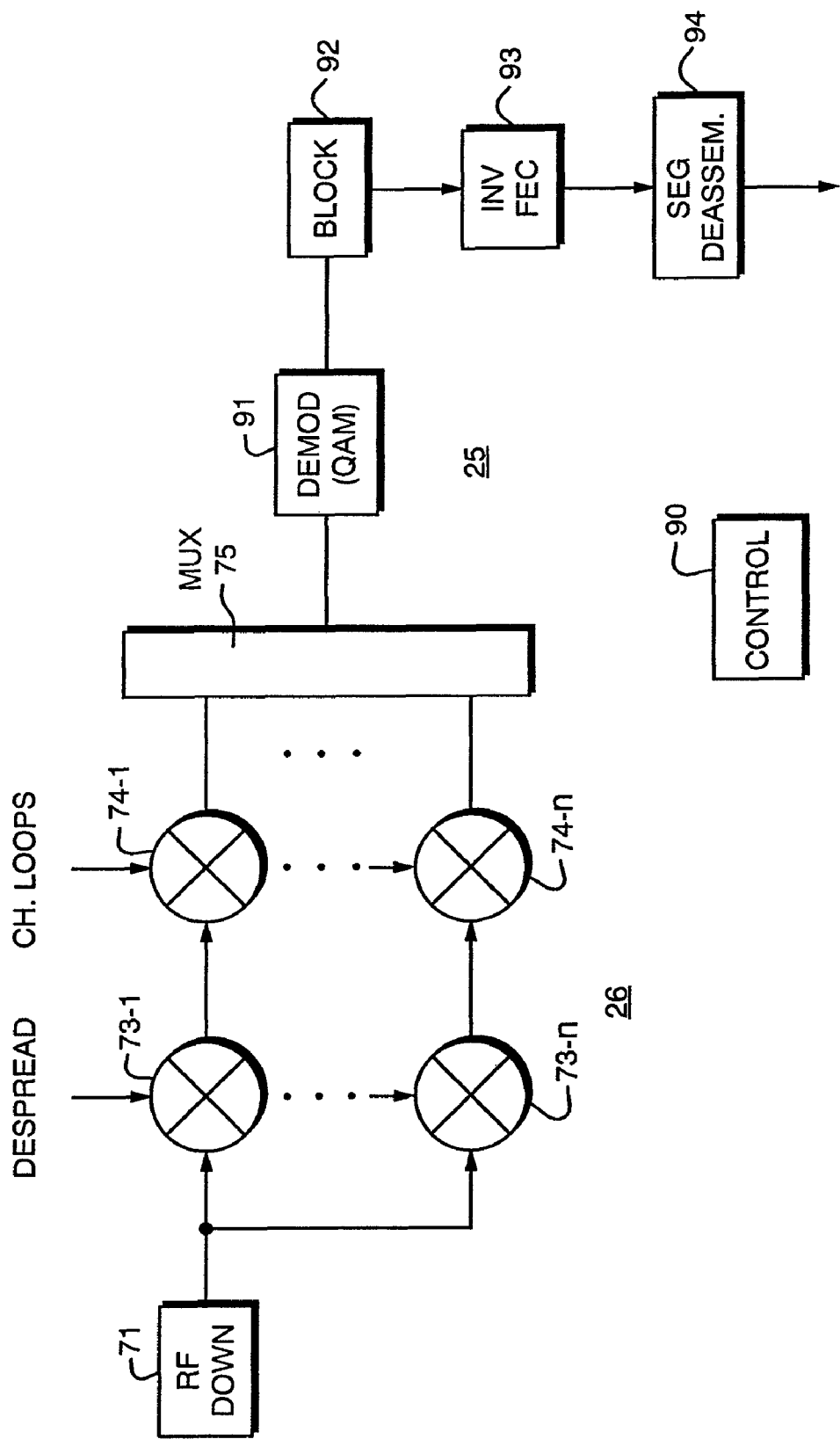
FIG. 4 is a diagram illustrating a protocol converter at a receiver that reassembles the network layer frames.

Turning attention now to the discussion of the receiver in FIG. 4, a controller 90 executes a process which sets various parameters of the components of the multi-channel transceiver 26 and protocol converter 25. These include the needed information concerning symbol rate for the symbol demodulator 91, the FEC coding rate by the FEC decoder 92, the block size needed by the block decoder 93, and segment information needed by the segment disassembler 94.

In the multi-channel receiver 26, an RF down conversion circuit 71 provides a number of RF channels. A number, n, of receiver circuits individually process these signals to regenerate the sub-channel signals. In particular, a despreader 73 and channel separator 74, operate to reconstruct the individual sub-channels 31 at the receiver. The despreader 73 removes the PN spreading code applied at the transmitter by the spreader 64. The channel's separation block 74 removes the channel code applied by the channel coder 66. The resulting n sub-channel signals are then remultiplexed by the multiplexer 75 to produce a base-band signal consisting of a symbol stream. These base-band symbols are then combined and forwarded to the symbol demodulator 91. In the illustrated embodiment being discussed in connection with FIG. 3, the symbol demodulator 91 is a QPSK type detector. A block assembler 92 groups the demodulated symbols according to the FEC block size in effect.

Next, in connection with the protocol converter 25, an inverse FEC decoding 20 process is applied by FEC decoder 93. The FEC decoded bits are then provided to the segment disassembler 94. The segment disassembler 94 then outputs TCP/IP formatted frames that may be used by the terminal equipment 12.

As has been described above, being able to change the symbol modulation rate, FEC encoding rate, and block size provides several increased degrees of freedom in choosing the overall available data rate. FIG. 5 is a chart associated with available data rates assuming a constant block size of 4096 bits and a fundamental minimum data rate of 49.9125 kilobits per second (kbps), or approximately 0.50 Megabits per second (Mbps). In particular, the chart shows on the various rows thereof an assumed number of channel codes assigned to each connection. These range from 2, 4, 6, or 8 channel codes, up to a maximum of 28 codes being assigned per connection. The columns represent different combinations of symbol modulation rates implemented by the symbol modulator 63, FEC coding rate implemented by the FEC coder 62, and block size implemented by block encoder 61. Specifically, the rightmost column indicates a situation where there are four symbols per bit, i.e., QPSK modulation is selected for the symbol modulator 63. As indicated by the first number in the table heading, a block size of 4096 has been selected along with an FEC coding rate of one-third or 1331 bits per FEC block. The cumulative effective data rate that is therefore available in the case of assigning only 2 channels is 0.50 MHz.

It is seen that as the number of assigned channel codes increases, the overall data rate achievable may be increased up to 0.699 megabits per second, which is the last column entry. Faster data rates are available by, of course, decreasing the effective FEC coding rate. For example, in the case represented by the second column from the right, a one-half rate code is selected, or 2048 information bits per block of 4096 bits (this is the example that was described in connection previously with FIG. 3). In this instance, it is seen that the overall data rates have been increased to provide a range of 0.076 Mbps up to and including 1.065 Mbps.

An increase in the FEC coding rate to a four-fifths rate code such that there are 20 3249 information bits per block size of 4096 provides even further increase in information bit rate, ranging from 0.122 Mbps up to 1.706 Mbps.

Faster data rates are available also by providing a change in the modulation type, i.e., number of bits per symbol. In the case illustrated the system supports 8, 16, or 64 bits per symbol effectively representing 8-PSK, 16 QAM, or 64 QAM symbol modulation. The available rates increase as indicated in the table.

In the maximum data rate case, 28 sub-channels have been assigned to a given connection with a modulation rate of 64 bits per symbol and an FEC coding rate of four-fifths. This combination, which is represented by the last entry in the left most column of the table, provides an information rate of 5.117 Mbps.

A similar table is illustrated in FIG. 6 for the case where the block size has been reduced to 2048.

Finally, FIG. 7 is a table for a 1024 block size. In this instance, only FEC code rates of one-third or two-thirds make sense, in that no four-fifths rate equivalent code is possible (i.e., 1024 times ⅘ is not a whole number). However, there is still a wide range of data rates available, from approximately the 50 kilobits per second, up to a rate which is the neighborhood of 4 Mbps.

By making code rate and symbol modulation rate adjustments in connection with a given block size, the PN codes used for the dispreading function and channel codes may be known to roll or shift in time in a known rate with respect to each symbol. For example, given a channel code rate of 32768 chips, rolling over 1024 symbols at 32 chips per symbol, higher symbol rate type modulation schemes that employ 3, 4, or 6 information bits per symbol (corresponding to the 8, 16, and 64 modulation type shown in the tables) are still compatible. In this way, no matter which modulation or symbol rate scheme is selected, there is always an integer number multiple of 1024 bits per epoch.

Assigning always at least 2 codes per user ensures that there are even number per blocks per PN epoch. This provides for increased simplicity in the implementation of the receiver, i.e., if there were an odd number of blocks per epoch, it would be necessary to buffer a block for a following epoch before being able to complete the construction of a frame.

While this invention has been particularly shown and described with references to preferred embodiments thereof, it will be understood by those skilled in the art that various changes in form and details may be made therein without departing from the scope of the invention encompassed by the appended claims.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a wireless transmit receive unit (WTRU), user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) or Ultra Wide Band (UWB) module.

What is claimed is:

1. A subscriber unit comprising:
   a forward error correction (FEC) decoder configured to:
      receive a plurality of data blocks, wherein each of the plurality of data blocks is a fixed size and each of the plurality of data blocks is encoded with a respective FEC code having a respective FEC code rate; and
      to FEC decode the plurality of data blocks using the respective FEC code for each of the plurality of data blocks to generate a plurality of decoded segments, wherein each of the plurality of decoded segments is a variable number of data bits based on the respective FEC code rates.

2. The subscriber unit of claim 1, further comprising:
   a controller configured to select a FEC code rate and to signal the selected FEC code rate to the FEC decoder.

3. The subscriber unit of claim 2, further comprising:
   a segment disassembler configured to generate a data frame based on the plurality of decoded segments.

4. The subscriber unit of claim 1, further comprising:
   a demodulator configured to demodulate a received signal and to generate the plurality of data blocks.

5. The subscriber unit of claim 4, wherein the demodulator is configured to demodulate the received signal using a Quadrature Phase Shift Keying (QPSK) modulation scheme.

6. The subscriber unit of claim 4, wherein the demodulator is configured to demodulate the received signal using a Quadrature Amplitude Modulation (QAM) modulation scheme.

7. A method for use in a subscriber unit, the method comprising:
   receiving a plurality of data blocks, wherein each of the plurality of data blocks is a fixed size and each of the plurality of data blocks is encoded with a respective error correction code having a respective FEC code rate; and
   FEC decoding the plurality of data blocks using the respective FEC code for each of the plurality of data blocks to generate a plurality of decoded segments, wherein each of the plurality of decoded segments is a variable number of data bits based on the respective FEC code rates.

8. The method of claim 7, further comprising:
   generating a data frame based on the plurality of decoded segments.

9. The method of claim 7, further comprising:
   demodulating a received signal to produce the plurality of data blocks.

10. The method of claim 9, wherein the demodulating uses a Quadrature Phase Shift Keying (QPSK) modulation scheme.

11. The method of claim 9, wherein the demodulating uses Quadrature Amplitude Modulation (QAM) modulation scheme.

* * * * *

UNITED STATES PATENT AND TRADEMARK OFFICE
CERTIFICATE OF CORRECTION

| | |
|---|---|
| PATENT NO. | : 8,204,140 B2 |
| APPLICATION NO. | : 12/326487 |
| DATED | : June 19, 2012 |
| INVENTOR(S) | : Hoffmann et al. |

It is certified that error appears in the above-identified patent and that said Letters Patent is hereby corrected as shown below:

ON THE TITLE PAGE

At Section (12) and (75) Inventors, after "John E.", delete "Hoffman" and insert --Hoffmann--.

At Section (56) U.S. PATENT DOCUMENTS, page 2, left column, after "5,606,574 A 2/1997 Hasegawa et al.", insert --5,608,738 3/1997 Matsushita--.

At Section (56) OTHER PUBLICATIONS, page 2, right column, before "Codes)", delete "(RCPD)" and insert --(RCPC)--.

At Section (56) OTHER PUBLICATIONS, page 2, right column, after "(Apr", delete "1998" and insert --1988--.

IN THE SPECIFICATION

At column 1, line 64, after "works", insert --and--.

At column 2, line 48, after "typically", delete "to".

At column 6, line 32, before "and the", delete "22" and insert --12--.

At column 6, line 32, after "and the", delete "network" and insert --Internet--.

At column 6, line 40, after "include rate", delete "adaption" and insert --adaptation--.

At column 7, line 54, after "shared frame", delete "segmentization" and insert --segmentation--.

At column 8, line 46, after "symbol", delete "modulator" and insert --modulators--.

Signed and Sealed this
Twenty-fifth Day of September, 2012

David J. Kappos
*Director of the United States Patent and Trademark Office*

At column 9, line 53, before "the symbol", delete "3," and insert --4,--.

At column 10, line 51, after "a rate which is" insert --in--.

At column 10, line 55, after "used for the", delete "dispreading" and insert --despreading--.